(12) United States Patent
Shi et al.

(10) Patent No.: US 11,393,553 B2
(45) Date of Patent: Jul. 19, 2022

(54) MEMORY TEST METHOD AND RELATED DEVICE

(71) Applicant: Changxin Memory Technologies, Inc., Anhui (CN)

(72) Inventors: Chuanqi Shi, Hefei (CN); Heng-Chia Chang, Hefei (CN); Li Ding, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/355,946

(22) Filed: Jun. 23, 2021

(65) Prior Publication Data

US 2021/0319844 A1 Oct. 14, 2021

Related U.S. Application Data

(63) Continuation of application No. PCT/CN2020/114513, filed on Sep. 10, 2020.

(30) Foreign Application Priority Data

Mar. 11, 2020 (CN) .......................... 202010166581.1

(51) Int. Cl.
*G11C 29/18* (2006.01)
*G11C 29/56* (2006.01)
(Continued)

(52) U.S. Cl.
CPC ........ *G11C 29/56008* (2013.01); *G11C 29/18* (2013.01); *G11C 29/46* (2013.01);
(Continued)

(58) Field of Classification Search
CPC ... G11C 29/56008; G11C 29/18; G11C 29/46; G11C 29/56004; G11C 29/56012;
(Continued)

(56) References Cited

U.S. PATENT DOCUMENTS

| 2001/0040829 A1 | 11/2001 | Arimoto et al. |
| 2004/0013016 A1 | 1/2004 | Yamazaki et al. |

(Continued)

FOREIGN PATENT DOCUMENTS

| CN | 1818701 A | 8/2006 |
| CN | 104205233 A | 12/2014 |

(Continued)

OTHER PUBLICATIONS

PCT International Search Report and the Written Opinion dated Dec. 17, 2020, issued in related International Application No. PCT/CN2020/114513 (8 pages).

(Continued)

*Primary Examiner* — Mohammed A Bashar
(74) *Attorney, Agent, or Firm* — Sheppard Mullin Richter & Hampton LLP

(57) ABSTRACT

A memory test method and apparatus, an electronic device, and a computer-readable storage medium are provided. The method includes: obtaining a test instruction; generating, in response to the test instruction, a test clock signal, a to-be-tested address and to-be-tested data; determining a to-be-tested memory from memories of a storage device, the storage device including a self-test circuit; writing the to-be-tested data into a storage unit corresponding to the to-be-tested address of the to-be-tested memory; reading output data from the storage unit corresponding to the to-be-tested address of the to-be-tested memory; and comparing the to-be-tested data and the output data to obtain a test result of the to-be-tested memory. The self-test circuit disposed in the storage device is used to implement a memory test process. Thus, the dependency on automatic test equipment is reduced, thereby improving test speed and reducing test cost.

19 Claims, 10 Drawing Sheets

(51) Int. Cl.
*G11C 29/46* (2006.01)
*G11C 29/40* (2006.01)

(52) U.S. Cl.
CPC .. *G11C 29/56004* (2013.01); *G11C 29/56012* (2013.01); *G11C 2029/4002* (2013.01)

(58) Field of Classification Search
CPC .......... G11C 2029/4002; G11C 29/006; G11C 29/1201; G11C 2029/4402; G11C 29/12015; G11C 29/14
See application file for complete search history.

(56) References Cited

U.S. PATENT DOCUMENTS

| | | |
|---|---|---|
| 2004/0179421 A1 | 9/2004 | Kim et al. |
| 2004/0230870 A1 | 11/2004 | Wang et al. |
| 2006/0190789 A1 | 8/2006 | Kebichi et al. |
| 2007/0168808 A1 | 7/2007 | Ong |
| 2010/0020585 A1* | 1/2010 | Rajan ........................ G11C 7/10 365/63 |
| 2014/0164833 A1 | 6/2014 | Kobla et al. |
| 2018/0095129 A1* | 4/2018 | Deutsch ................ G11C 29/40 |
| 2019/0198131 A1 | 6/2019 | Jang et al. |

FOREIGN PATENT DOCUMENTS

| | | |
|---|---|---|
| CN | 106556793 A | 4/2017 |
| CN | 107068196 A | 8/2017 |
| CN | 108899061 A | 11/2018 |

OTHER PUBLICATIONS

Extended European Search Report dated Apr. 13, 2022, issued in related European Application No. 20918133.8 (8 pages).
First Search dated Mar. 4, 2022, issued in related Chinese Application No. 202010166581.1 (2 pages).

* cited by examiner

MEMORY TEST METHOD AND RELATED DEVICE

CROSS-REFERENCE TO RELATED APPLICATIONS

This application is a continuation application of International Patent Application No. PCT/CN2020/114513, filed on Sep. 10, 2020, which claims priority to Chinese Patent Application No. 202010166581.1, filed on Mar. 11, 2020. The above-referenced applications are incorporated herein by reference in their entirety.

TECHNICAL FIELD

The present invention relates to the field of semiconductor test technologies, and more specifically, to a memory test method and a related device.

BACKGROUND

As the semiconductor feature size continues to decrease, the scale of Integrated Circuit (IC) design continues to increase. Highly complex IC products face increasing challenges to achieve high reliability, high quality, low costs, and short product launch cycles. On one hand, as the semiconductor feature size decreases, the various types of potential defects in memories increase. On the other hand, with the increasing complexity of the IC products, the share of memories such as Random-Access Memory (RAM) in IC products is becoming increasingly higher.

As shown in FIG. 1, when an Automatic Test Equipment (ATE) is used to test a DRAM using Direct Access Pads (DA Pads), as the bit width of a Dynamic Random-Access Memory (DRAM) increases, one touch down (i.e., one contact between a probe card that is used for the test and the DA pads) may not be able to test all the wafer. Additionally, a test clock is provided by the ATE directly to a DRAM die, and a high-speed apparatus is needed for high-speed test, which increases the test cost. Furthermore, a large number of DA pads may need to be provided on the die integrating the controller, resulting in high preparation costs.

The information disclosed in the background part is only used to enhance the understanding of the background of the present invention and therefore can include information that does not constitute the prior art known to a person of ordinary skill in the art.

SUMMARY

In view of the limitations of the existing techniques described above, the present invention provides a memory test method and a related device to overcome technical problems associated with the existing technique when ATE is used to test a memory, including high test cost, long test time, and hampered test speed.

One aspect of the present invention is directed to a memory test method. The method may include obtaining a test instruction; generating, in response to the test instruction, a test clock signal, a to-be-tested address and to-be-tested data; determining a to-be-tested memory from memories of a storage device, the storage device comprising a self-test circuit; writing the to-be-tested data into a storage unit corresponding to the to-be-tested address of the to-be-tested memory; reading output data from the storage unit corresponding to the to-be-tested address of the to-be-tested memory; and comparing the to-be-tested data and the output data to obtain a test result of the to-be-tested memory.

In some embodiments, the self-test circuit may include a first-in-first-out queue. Obtaining a test instruction may include: buffering, by using the first-in-first-out queue, a command signal sent by automatic test equipment, wherein a working frequency of the test clock signal is higher than a frequency of a clock signal output by the automatic test equipment, or if the frequency of the test clock signal is equal to the frequency of the clock signal output by the automatic test equipment, a phase of the test clock signal is different from a phase of the clock signal output by the automatic test equipment; and reading the command signal from the first-in-first-out queue.

In some embodiments, obtaining a test instruction may further include determining a target working mode of the self-test circuit; and parsing the command signal based on the target working mode and setting the command signal to be the test instruction.

In some embodiments, determining a target working mode of the self-test circuit may include obtaining, from the automatic test equipment, first configuration information; and determining, based on the first configuration information, the target working mode.

In some embodiments, the self-test circuit may further include a clock signal generator. The method may further include: obtaining, from the automatic test equipment, second configuration information; determining, based on the second configuration information, the frequency of the test clock signal; and generating, by the clock signal generator, the test clock signal meeting the frequency.

In some embodiments, reading the command signal from the first-in-first-out queue may include: obtaining, from the automatic test equipment, third configuration information; determining, based on the third configuration information, a reading frequency of the command signal; and, in response to the reading frequency being equal to the frequency of the test clock signal, reading, based on the test clock signal, the command signal from the first-in-first-out queue.

In some embodiments, reading the command signal from the first-in-first-out queue may further include: in response to the reading frequency being equal to the frequency of the clock signal output by the automatic test equipment, reading, based on the clock signal output by the automatic test equipment, the command signal from the first-in-first-out queue.

In some embodiments, determining a to-be-tested memory from memories of a storage device may include: obtaining, from the automatic test equipment, fourth configuration information; and determining, based on the fourth configuration information, the to-be-tested memory, the to-be-tested memory being one or more target memories in the storage device.

In some embodiments, writing the to-be-tested data into a storage unit corresponding to the to-be-tested address of the to-be-tested memory may include: in response to the to-be-tested memory being one target memory in the storage device, writing the to-be-tested data into a storage unit corresponding to a to-be-tested address of the target memory.

In some embodiments, writing the to-be-tested data into a storage unit corresponding to the to-be-tested address of the to-be-tested memory may include: in response to the to-be-tested memory being a plurality of target memories in the storage device, respectively writing the to-be-tested data into storage units corresponding to to-be-tested addresses of the plurality of target memories.

In some embodiments, comparing the to-be-tested data and the output data to obtain a test result of the to-be-tested memory may include: comparing the to-be-tested data and the output data to obtain a comparison result; and in response to the comparison result being not matching, recording the to-be-tested address corresponding to the to-be-tested data as an incorrect address, the test result comprising the incorrect address.

In some embodiments, the self-test circuit may include a volatile storage unit and a non-volatile storage unit. The method may further include writing the test result of the to-be-tested memory into the volatile storage unit; and writing the test result in the volatile storage unit into the non-volatile storage unit for storage.

In some embodiments, the self-test circuit may include a non-volatile storage unit, configured to store an incorrect address of the to-be-tested memory. Generating, in response to the test instruction, a to-be-tested address may include obtaining the incorrect address stored in the non-volatile storage unit; and automatically skipping the incorrect address when generating the to-be-tested address.

In some embodiments, the storage device may further include a controller. The self-test circuit may be located in the controller.

In some embodiments, the memories of the storage device may be vertically stacked on or beneath the controller.

In some embodiments, the self-test circuit may be located in a memory of the storage device.

In some embodiments, the method may be performed by the self-test circuit.

Another aspect of the present invention is directed to a memory test apparatus. The apparatus may include a test instruction obtaining unit, an address data generation unit, a to-be-tested memory determining unit, a to-be-tested data writing unit, an output data reading unit, and a test result obtaining unit.

The test instruction obtaining unit may be configured to obtain a test instruction. The address data generation unit may be configured to generate, in response to the test instruction, a test clock signal, a to-be-tested address and to-be-tested data. The to-be-tested memory determining unit may be configured to determine a to-be-tested memory from memories of a storage device. The storage device may include a self-test circuit. The to-be-tested data writing unit may be configured to write the to-be-tested data into a storage unit corresponding to the to-be-tested address of the to-be-tested memory. The output data reading unit may be configured to read output data from the storage unit corresponding to the to-be-tested address of the to-be-tested memory. The test result obtaining unit may be configured to compare the to-be-tested data and the output data to obtain a test result of the to-be-tested memory.

Another aspect of this invention is directed to an electronic device. The device may include one or more processors and a storage medium. The storage medium may be configured to store one or more programs. Upon being executed by the one or more processors, the one or more programs may cause the one or more processors to perform any one of the foregoing memory test methods.

Another aspect of this invention is directed to a computer-readable storage medium. The storage medium may store a computer program. Upon being executed by a processor, the computer program may cause any one of the foregoing memory test methods be performed.

According to the memory test method and apparatus, the electronic device, and the computer-readable storage medium provided in some embodiments of the present invention, a self-test circuit is added to complete a memory test, so that the test for a whole wafer may be completed by using a small quantity of DA pads in one touch down. The self-test circuit may generate a high-speed clock for a memory test, allowing a high-speed memory test be completed using a low-speed ATE, thereby reducing test time and test cost.

The foregoing general descriptions and the following detailed descriptions are merely examples and explanations and do not intend to limit the present invention.

BRIEF DESCRIPTION OF THE DRAWINGS

The accompanying drawings illustrate embodiments in accordance with the present invention and are used to explain the principle of the present invention. The accompanying drawings in the following descriptions show merely some embodiments of the present invention. A person of ordinary skill in the art may still derive other accompanying drawings from these accompanying drawings without creative efforts.

DETAIL DESCRIPTION OF THE EMBODIMENTS

The exemplary implementations are comprehensively described with reference to the accompanying drawings. The invention of this specification can be implemented in a plurality of forms, and the exemplary implementations described herein do not intend to be limiting. Providing these implementations makes the present invention more comprehensive and complete, and the concepts of the exemplary implementations are comprehensively conveyed to a person skilled in the art.

The accompanying drawings are merely schematic diagrams of the present specification and are not necessarily drawn to scale. Same reference signs in the figures represent same or similar parts, and therefore are not repeatedly described.

Although relative terms such as "on" and "under" are used in the specification to describe a relative relationship of a component with a reference sign to another component with a reference sign, these terms are used in the specification for convenience only, for example, indicate directions in the examples described according to the accompanying drawings. If an apparatus with a reference sign is inverted, a component described to be "on" becomes a component described to be "under." When a structure is "on" another structure, it may mean that the structure is integrated onto the another structure, or that the structure is "directly" disposed on the another structure, or that the structure is "indirectly" disposed on the another structure by using another structure.

The terms "one", "a", and "the" are used to indicate the existence of one or more elements/components/etc. The terms "include" and "have" are used to indicate open inclusion and the existence of an element/a component/etc., in addition to the listed element/component/etc. The terms such as "first" and "second" each are merely used as a sign and constitute no limitation on the number of its object.

Figure 1:
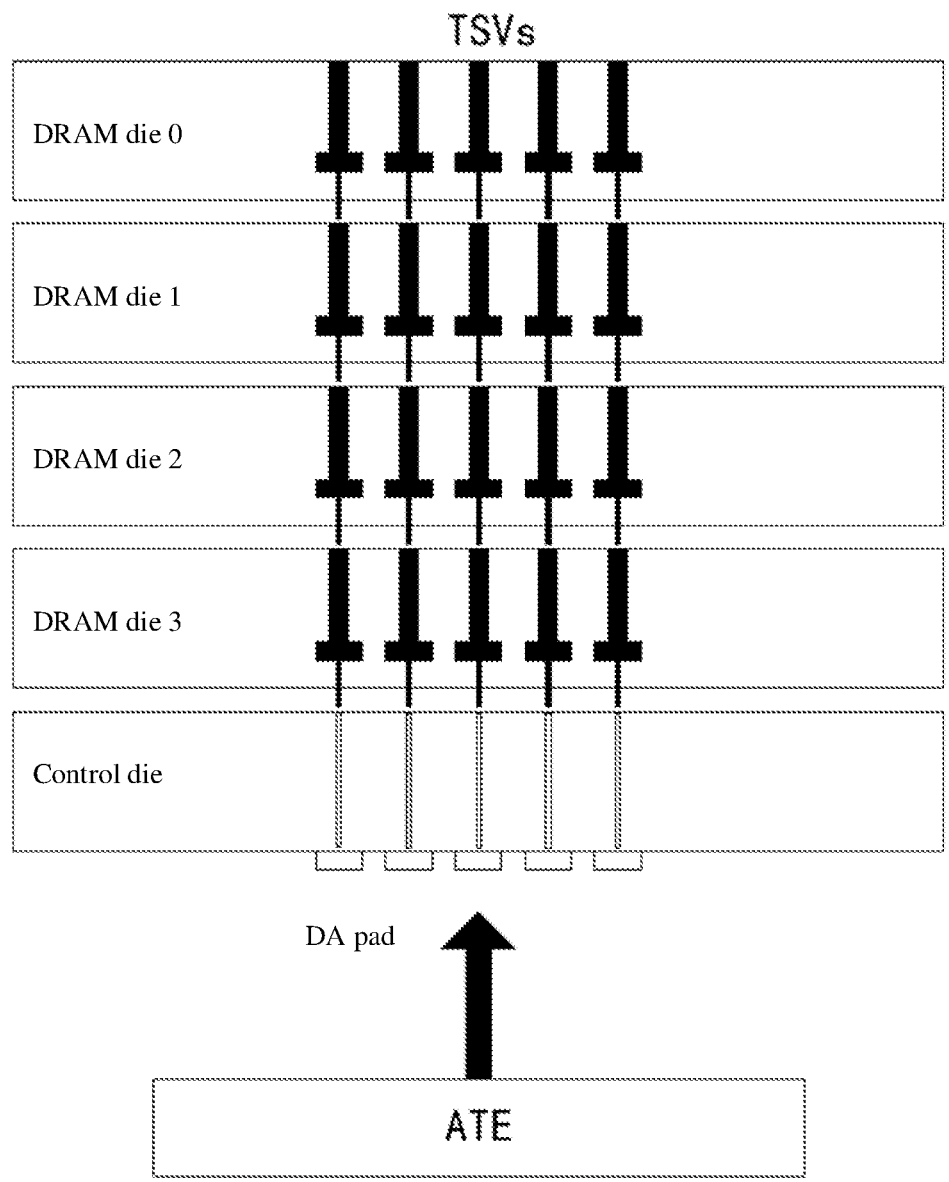
FIG. 1 is a schematic diagram of testing a DRAM in related art.
Figure 2:
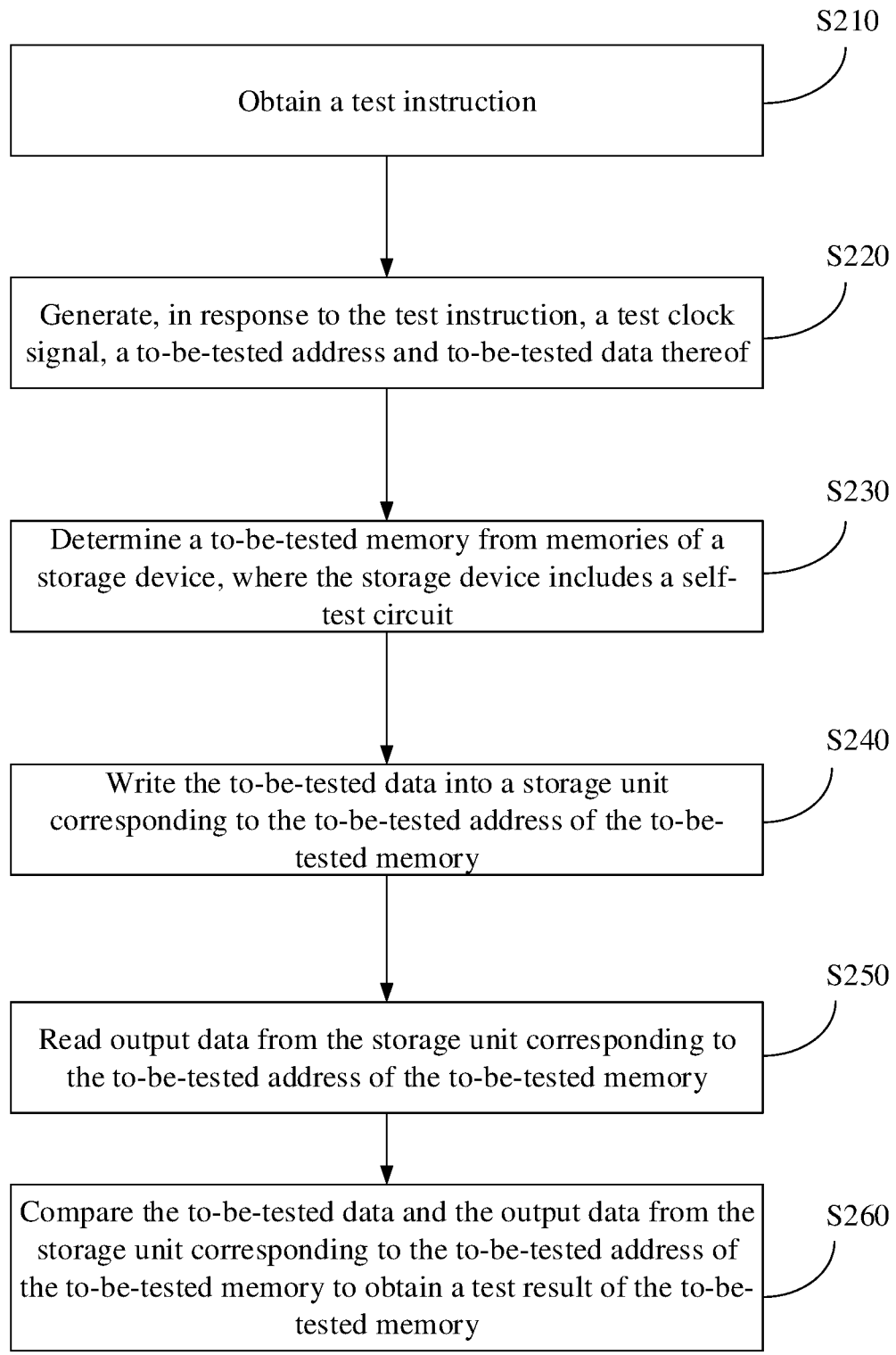
FIG. 2 is a schematic flowchart of a memory test method according to an embodiment of the present invention.

FIG. 2 is a schematic flowchart of a memory test method according to an embodiment of the present invention. As shown in FIG. 2, the method provided in this embodiment of the present invention may include the following steps.

In some embodiments, the method may be performed by a self-test circuit. The self-test circuit may be an internal circuit with a test capability in a storage device, and therefore may also be referred to as a built-in self-test (BIST) circuit. The BIST circuit may be disposed in a controller in a storage device corresponding to a to-be-tested memory or may be disposed in a memory die such as a DRAM die in the storage device. This is not limited in the present invention.

In step S210, a test instruction may be obtained.

In some embodiments, the self-test circuit may include a First-In-First-Out (FIFO) queue.

The test instruction may be obtained by first buffering, using the FIFO queue, a command signal sent by automatic test equipment (ATE).

A working frequency of a test clock signal may be higher than a frequency of a clock signal output by the ATE.

Alternatively, the frequency of the test clock signal may be equal to the frequency of the clock signal output by the ATE, and a phase of the test clock signal may be different from a phase of the clock signal output by the ATE.

Then, the test instruction may be obtained by reading the command signal from the FIFO queue.

The frequency mismatch between a low-speed clock of the ATE and a high-speed clock of the BIST circuit may cause the data sent by the ATE to the BIST circuit be lost. Even if the ATE and the BIST circuit use the same clock frequency, phase inconsistency between the ATE and the BIST circuit may also cause the data lose. In the embodiments of the present invention, data sent by the ATE to the BIST circuit is buffered using the build-in FIFO queue of the BIST circuit. Thus, the frequency mismatch (or phase inconsistency) between the ATE and the BIST circuit may be resolved, thereby preventing the data sent by the ATE to the BIST circuit from being lost. Additionally, the data sent by the ATE to the BIST circuit may be stored using the FIFO queue to avoid frequent bus operations and reduce the burden on the central processing unit.

In some embodiments, reading the command signal from the FIFO queue may include: obtaining third configuration information from the ATE; determining a reading frequency of the command signal based on the third configuration information; and in response to the reading frequency being equal to the frequency of the test clock signal, reading the command signal from the FIFO queue based on the test clock signal.

In some embodiments, reading the command signal from the FIFO queue may further include: in response to the reading frequency being equal to the frequency of the clock signal output by the ATE, reading the command signal from the FIFO queue based on the clock signal output by the ATE.

In some embodiments, the ATE may send the third configuration information to the BIST circuit to specify the frequency at which the buffered command signal is read from the FIFO queue in the BIST circuit. It may be specified that the buffered command signal is read from the FIFO queue in the BIST circuit based on the high-speed clock generated by the BIST circuit or based on the low-speed clock of the ATE. This is not limited in the present invention.

In some embodiments, obtaining a test instruction may further include: determining a target working mode of the self-test circuit; and parsing the command signal based on the target working mode and setting the command signal to be the test instruction.

In some embodiments, determining a target working mode of the self-test circuit may include: obtaining first configuration information from the ATE; and determining the target working mode based on the first configuration information.

In some embodiments, since the BIST circuit has a limited quantity of command pins, which limits the quantity of instructions they can represent by parsing the command signals. Thus, some command signals sent by the ATE to the BIST circuit may not be effectively represented.

Therefore, different working modes may be set. In different working modes, a same pin signal may represent different command signals according to different working modes. Therefore, the limited quantity of command pins may be reused to represent more command signals.

For example, an AND gate, one of the simplest gates, may have two input pins, which may represent only four different command signals: "11", "01", "10", and "00". When different working modes are introduced, "11", "01", "10", and "00" may respectively represent more instructions. For example, in a first working mode (e.g., a test mode in which a DRAM die is tested), "11", "01", "10", and "00" may respectively represent four different instructions during the test of the DRAM die. In a second working mode (e.g., a test mode in which a controller is tested), "11", "01", "10", and "00" may respectively represent four different instructions during the test of the controller. The example herein is merely used for description. Actual types, quantities, control logic of the working modes may be determined based on an actual need and are not limited in this invention.

In step S220, in response to the test instruction, the test clock signal, a to-be-tested address and to-be-tested data may be generated.

In some embodiments, the self-test circuit may further include a clock signal generator. A clock signal output by the clock signal generator that is built-in in the BIST circuit may be used to test a memory, and therefore the clock signal may also be referred to as the test clock signal. The clock signal generator may generate a high-speed clock signal by using a low-speed clock signal of the ATE, and therefore may also be referred to as a high-speed clock generator.

In some embodiments, "low-speed" and "high-speed" are relative terms. That is, a frequency of a clock signal generated by the BIST circuit may be higher than a frequency of a clock signal generated by the ATE. Therefore, the clock signal generated by the ATE is referred to as a low-speed clock signal, and the clock signal generated by the BIST circuit is referred to as a high-speed clock signal. A specific frequency value may be determined based on an actual situation of a tested DRAM die and is not limited in the present invention.

The memory test method may further include obtaining second configuration information from the ATE; determining the frequency of the test clock signal based on the second configuration information; and generating, by using the clock signal generator, the test clock signal meeting the frequency.

When performing the test method, the BIST circuit may use a computer to generate, by using a to-be-tested data generation algorithm, various pieces of to-be-tested data for testing a to-be-tested memory. Then, the ATE may read the to-be-tested data from the computer and send the to-be-tested data to the BIST circuit. Then, the BIST circuit may send the to-be-tested data to the to-be-tested memory for testing. Alternatively, the to-be-tested data generation algorithm may be built-in in the ATE or the BIST circuit, and the ATE or the BIST circuit may generate the to-be-tested data by itself.

When a plurality of memory dies in the storage device corresponding to the controller share a peripheral pin, one or more memory dies to which the to-be-tested data is to be sent may need to be first determined from the plurality of memory dies. In this case, the ATE may first send the obtained to-be-tested data to the controller, and the controller may determine which memory dies are to-be-tested memories, and then send the received to-be-tested data to the to-be-tested memories for testing. In this way, the ATE may test a plurality of memory dies in parallel by using a small quantity of peripheral pins of the storage device, without being limited by the quantity of peripheral pins of the storage device.

In step S230, the to-be-tested memory may be determined from memories of the storage device. The storage device may include the self-test circuit.

In some embodiments, the to-be-tested memory may be determined from memories of the storage device by: obtaining fourth configuration information from the ATE; and determining the to-be-tested memory based on the fourth configuration information. The to-be-tested memory may be one or more target memories in the storage device.

In some embodiments, the ATE may send the fourth configuration information to the BIST circuit to specify to test a specific memory in the storage device, or test all or some of the memories in parallel. The BIST circuit may simultaneously test all the memory dies in the storage device, thereby reducing test time, improving test efficiency, and reducing test cost.

In some embodiments, the storage device may further include the controller, and the self-test circuit may be located in the controller.

In some embodiments, the memories of the storage device may be vertically stacked on or beneath the controller. Alternatively, the memories of the storage device may be horizontally interconnected to the controller. The present specification is not limited in this regard.

In some embodiments, the to-be-tested memory may include a plurality of memory dies, and the plurality of memory dies may belong to the same storage device. Additionally, the controller and the plurality of memory dies may also belong to the same storage device. In some embodiments, the plurality of memory dies of the to-be-tested memory may be vertically stacked on the controller consecutively.

In some other embodiments, the plurality of memory dies of the to-be-tested memory may be vertically stacked beneath the controller consecutively. In other embodiments, the plurality of memory dies of the to-be-tested memory may be vertically stacked consecutively, and the plurality of memory dies vertically stacked consecutively may be horizontally interconnected to the controller. In some other embodiments, the plurality of memory dies of the to-be-tested memory and the controller may be horizontally distributed on the storage device. This is not limited in the present invention.

In some embodiments, the self-test circuit may be located in a memory of the storage device. The BIST circuit may also be disposed in any memory in the storage device in which the to-be-tested memory is located.

In some embodiments, the to-be-tested memory may be any type of memory, for example, a DRAM or a Static Random-Access Memory (SRAM). The to-be-tested memory may be one of, some of, or all of the memory dies in a storage device.

In step S240, the to-be-tested data may be written into a storage unit corresponding to the to-be-tested address of the to-be-tested memory.

In some embodiments, the BIST circuit may write the to-be-tested data into the storage unit corresponding to the to-be-tested address of the to-be-tested memory based on the test clock signal generated in the foregoing step.

In some embodiments, writing the to-be-tested data into a storage unit corresponding to the to-be-tested address of the to-be-tested memory may include: in response to the to-be-tested memory being one target memory in the storage device, writing the to-be-tested data into a storage unit corresponding to a to-be-tested address of the target memory.

In some embodiments, if a memory in the storage device is specified by the BIST circuit for testing, the BIST circuit may write the to-be-tested data into storage units of the memory consecutively. For example, in response to the specified memory being the first memory in the storage device and the first memory having 10,000 storage units, the BIST circuit may write the first bit of the to-be-tested data into the first storage unit of the first memory, and the second bit of the to-be-tested data into the second storage unit of the first memory, etc.

In some embodiments, writing the to-be-tested data into a storage unit corresponding to the to-be-tested address of the to-be-tested memory may include: in response to the to-be-tested memory being a plurality of target memories in the storage device, respectively writing the to-be-tested data into storage units corresponding to to-be-tested addresses of the plurality of target memories.

In some embodiments, the BIST circuit may parallelly test all the memories in the storage device, then the BIST circuit may respectively write the to-be-tested data into storage units of the memories consecutively. For example, when there exists a total of four memories, each having 10,000 storage units, the BIST circuit may respectively write the first bit in the to-be-tested data into the first storage units of the four memories, respectively write the second bit in the to-be-tested data into the second storage units of the four memories, etc.

In step S250, output data from the storage unit corresponding to the to-be-tested address of the to-be-tested memory may be read.

In some embodiments, the BIST circuit may read the output data from the storage unit corresponding to the to-be-tested address of the to-be-tested memory based on the test clock signal generated in the foregoing step.

In step S260, the to-be-tested data and the output data may be compared to obtain a test result of the to-be-tested memory.

In some embodiments, comparing the to-be-tested data and the output data to obtain a test result of the to-be-tested memory may include: comparing the to-be-tested data and the output data to obtain a comparison result; and in response to the comparison result being not matching, recording the to-be-tested address corresponding to the to-be-tested data as an incorrect address. The test result may include the incorrect address.

In this embodiment, the BIST circuit may be used to test a to-be-tested memory. For example, the BIST circuit may input a known character string consisting of "0" and/or "1" to storage units corresponding to addresses of the to-be-tested memory. After a specific delay, the BIST circuit may read the character string from the storage units corresponding to the addresses; and perform an exclusive OR operation on the previously input character string and the subsequently read character string consecutively to determine whether a specific storage unit having an error. In this case, an address of the storage unit having the error may be recorded. That is, a test result of the to-be-tested memory may include the address corresponding to the storage unit having the error in the to-be-tested memory, which may be referred to as an incorrect address.

In some embodiments, the self-test circuit may include a volatile storage unit (Volatile Memory) and a non-volatile storage unit (Non-volatile Memory). The method may further include writing the test result of the to-be-tested memory into the volatile storage unit; and writing the test result in the volatile storage unit into the non-volatile storage unit for storage.

In some embodiments, considering that the non-volatile storage unit has a low data writing speed and the high-speed clock signal is used by the BIST circuit to test the to-be-tested memory, to prevent the loss of the test result, the generated test result may first be written into the volatile storage unit, where a data writing speed of the volatile storage unit is greater than the data writing speed of the non-volatile storage unit, thereby effectively preventing the loss of the test result data. Additionally, considering that data in a volatile storage unit will be lost after the volatile storage unit is powered off, the test result in the volatile storage unit may be periodically written into the non-volatile storage unit for storage.

In some embodiments, the self-test circuit may include a non-volatile storage unit, and the non-volatile storage unit may be configured to store an incorrect address of the to-be-tested memory. Generating, in response to the test instruction, a to-be-tested address may include: obtaining the incorrect address stored in the non-volatile storage unit; and automatically skipping the incorrect address when generating the to-be-tested address.

In an actual test process, the same storage device or memory may be tested multiple times. To avoid repeatedly testing a same storage unit of a same memory, test results obtained in one or all previous test processes may be stored in the non-volatile storage unit.

During a new test, the storage units that have been tested may be first identified based on the test results stored in the non-volatile storage unit. In this case, these incorrect addresses may be automatically skipped when generating the to-be-tested address to improve test efficiency and avoid a waste of test resources.

In an actual design scenario of the storage device, a separate redundancy area may need to be designated in each memory to store a test result, such as the foregoing incorrect address, of the memory in a test process. Therefore, the design area of the memory may need to be increased to accommodate for the redundancy area. The redundancy area needs to be designed in each memory, which increases the complexity of the control and architecture of the storage device.

In some embodiments, the non-volatile storage unit may be provided in the BIST circuit, and the non-volatile storage unit may be used to store test results of all the memories in the storage device, eliminating the need for a redundancy area in any memory in the storage device. Thus, the volume of the storage device may be reduced, thereby simplifying the structure and design of the storage device.

In some embodiments, the BIST circuit may further analyze a cause of the error based on the obtained test result of the to-be-tested memory to identify recovery information for recovering the storage unit having the error. The test result of the to-be-tested memory may include the address corresponding to the storage unit having the error in the to-be-tested memory (i.e., the incorrect address) and the recovery information for recovering the storage unit corresponding to the incorrect address.

In some embodiments, the recovery information of the to-be-tested memory may further include spare circuit information in the to-be-tested memory. The spare circuit information may refer to some redundant spare storage units, in addition to storage units conventionally designed to store data, in the memory to ensure the reliability. For example, 200 spare storage units may be added to a first memory in addition to conventional 10,000 storage units included in the first memory. In a test process or an actual application process, when an error is found in the conventional 10,000 storage units, a faulty storage unit may be directly replaced by a spare storage unit. The replacement may be an address replacement of the storage unit instead of a physical replacement. In some examples, while recovering the storage unit having the error, a spare storage unit may be used to replace the storage unit before the recovery is completed to maintain the normal functionality of the memory.

According to the memory test method disclosed in some embodiments of the present invention, on one hand, the self-test circuit is added and used to complete a memory test process, so that a whole wafer may be tested by using a small quantity of DA pads in one touch down. On the other hand, the self-test circuit is used to generate a high-speed clock for a memory test, so that a high-speed memory test can be conducted by using a low-speed ATE, thereby reducing test time and test cost.

An example is provided below to explain the memory test method in greater details. The storage device is a DRAM in the example below. Apparently, this memory test method is applicable to other types of memory, and the present specification is not limited in this regard.

Figure 3:
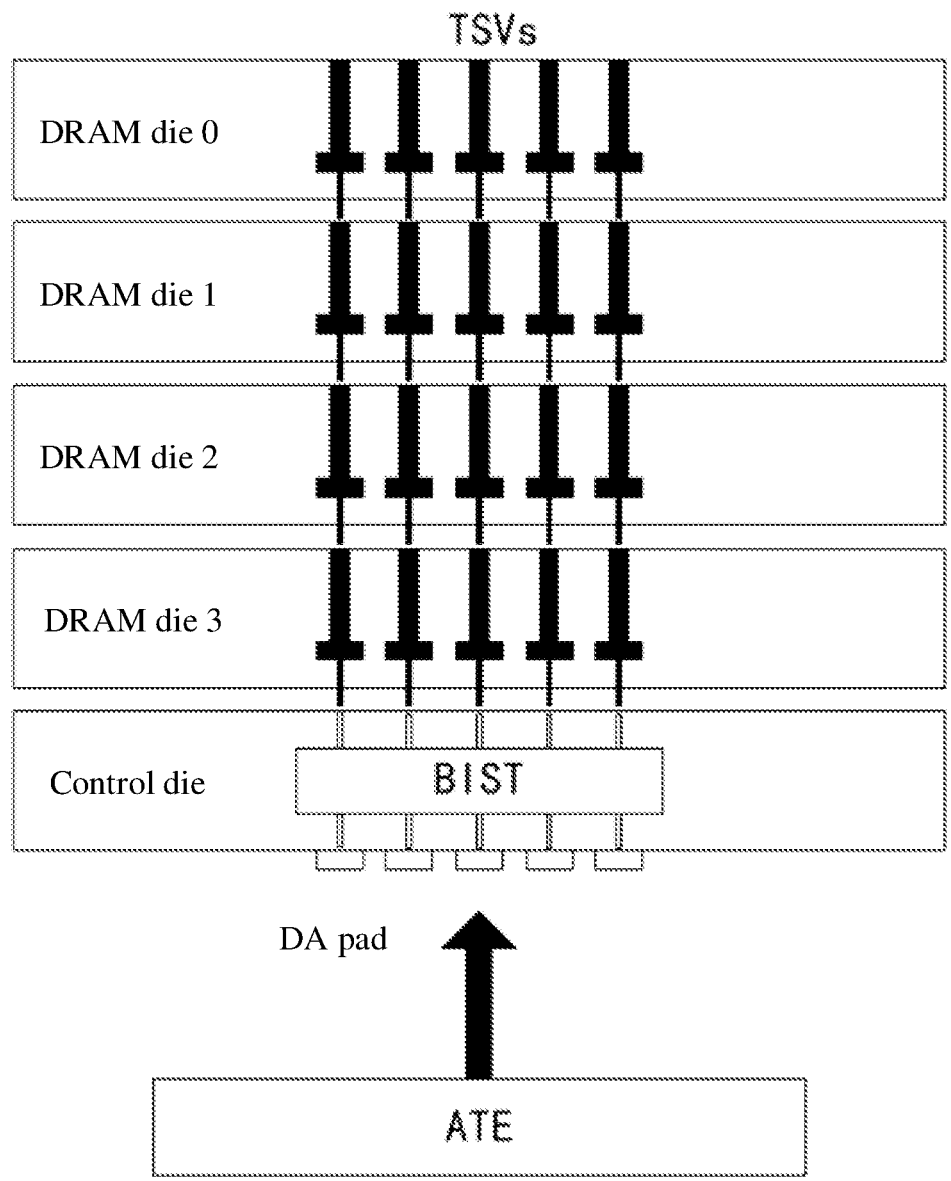
FIG. 3 is a schematic diagram of a memory test method according to an embodiment of the present invention.

FIG. 3 is a schematic diagram of a memory test method according to an embodiment of the present invention. In the example shown in FIG. 3, a storage device including four DRAM dies (DRAM dies 0 to 3) may be stacked on a controller, and the four DRAM dies may be electrically connected through Through-Silicon Vias (TSVs).

The controller may include a BIST circuit, and the DRAM dies 0 to 3 may be vertically stacked on the controller consecutively. In a stacked storage device, several DRAM dies may be vertically stacked together. Compared with a conventional storage device, the stacked storage device has advantages in line layout, bandwidth, and latency, etc. The stack stage device not only occupies less space compared to a conventional storage device, but also has a shorter die spacing, resulting in shorten signal transmission path and less signal delay. In the stacked storage device, the TSV technology may be used to punch vias in edges or specific locations of the DRAM dies, and these vias may be used as channels for wiring and vertical interconnection.

In a storage device with a stacked structure, although vertical stacking allows a higher density of memory dies in a unit space, it also makes it difficult for a controller to manage the memory dies. Therefore, in the embodiments shown in FIGS. 4 and 5, a new level of control mechanism may be introduced in addition to the original level of control mechanism.

Figure 4:
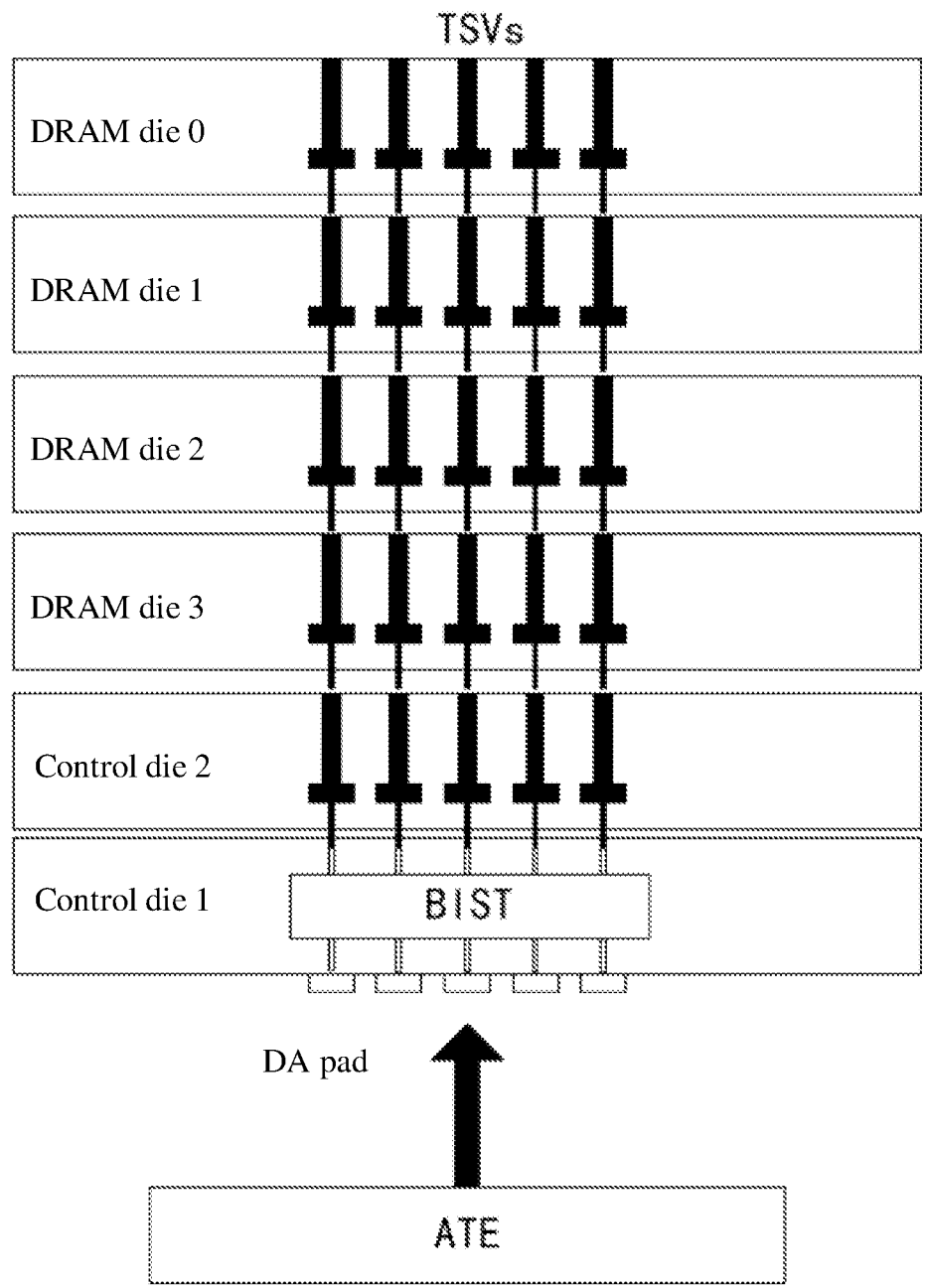
FIG. 4 is a schematic diagram of a memory test method according to an embodiment of the present invention.
Figure 5:
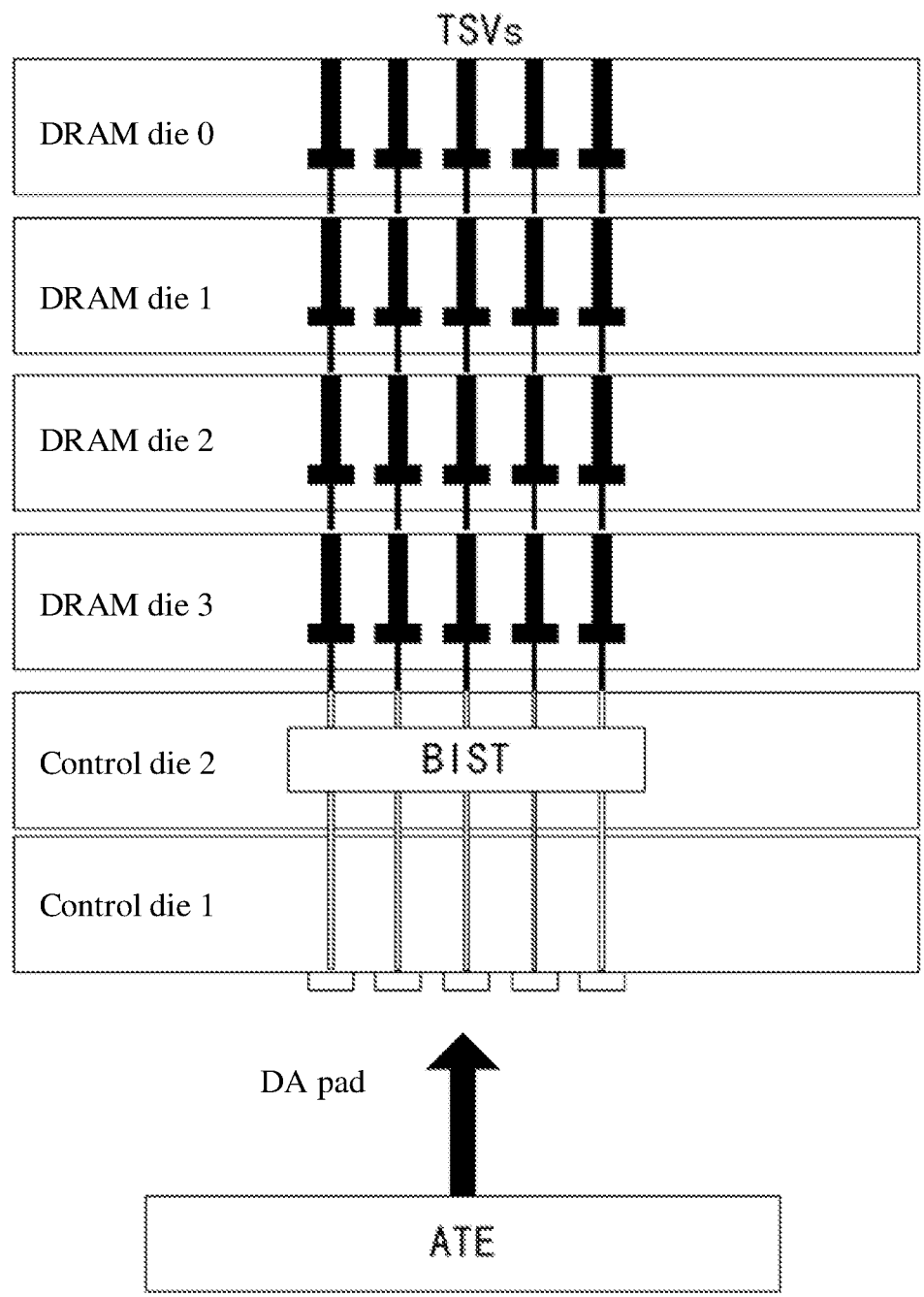
FIG. 5 is a schematic diagram of a memory test method according to an embodiment of the present invention.

As shown in FIGS. 4 and 5, each TSV memory die may have an independent base/logic die (controller 2) at a bottom layer, and a controller is integrated to manage the cluster of stacked DRAM dies. The base/logic die may directly communicate with a controller 1 in a GPU/CPU/Soc, etc., and may be used to collect data in the stacked DRAM dies and help the controller 1 in the GPU/CPU/Soc manage the stacked DRAM dies.

In the stacked system, it is not necessary to significantly increase the scale of the controller 1 including the GPU/CPU/Soc, etc. The controller 1 including the GPU/CPU/Soc, etc. may only need to interact with the controller 2 in the base/logic die, which manage each layer of DRAM die in each cluster.

In the embodiment shown in FIG. 4, the BIST circuit may be disposed in the controller 1. In the embodiment shown in FIG. 5, the BIST circuit may be disposed in the controller 2. Regardless its location, the BIST circuit can test, in series or in parallel, any one or more of the DRAM dies stacked on the BIST circuit.

Figure 6:
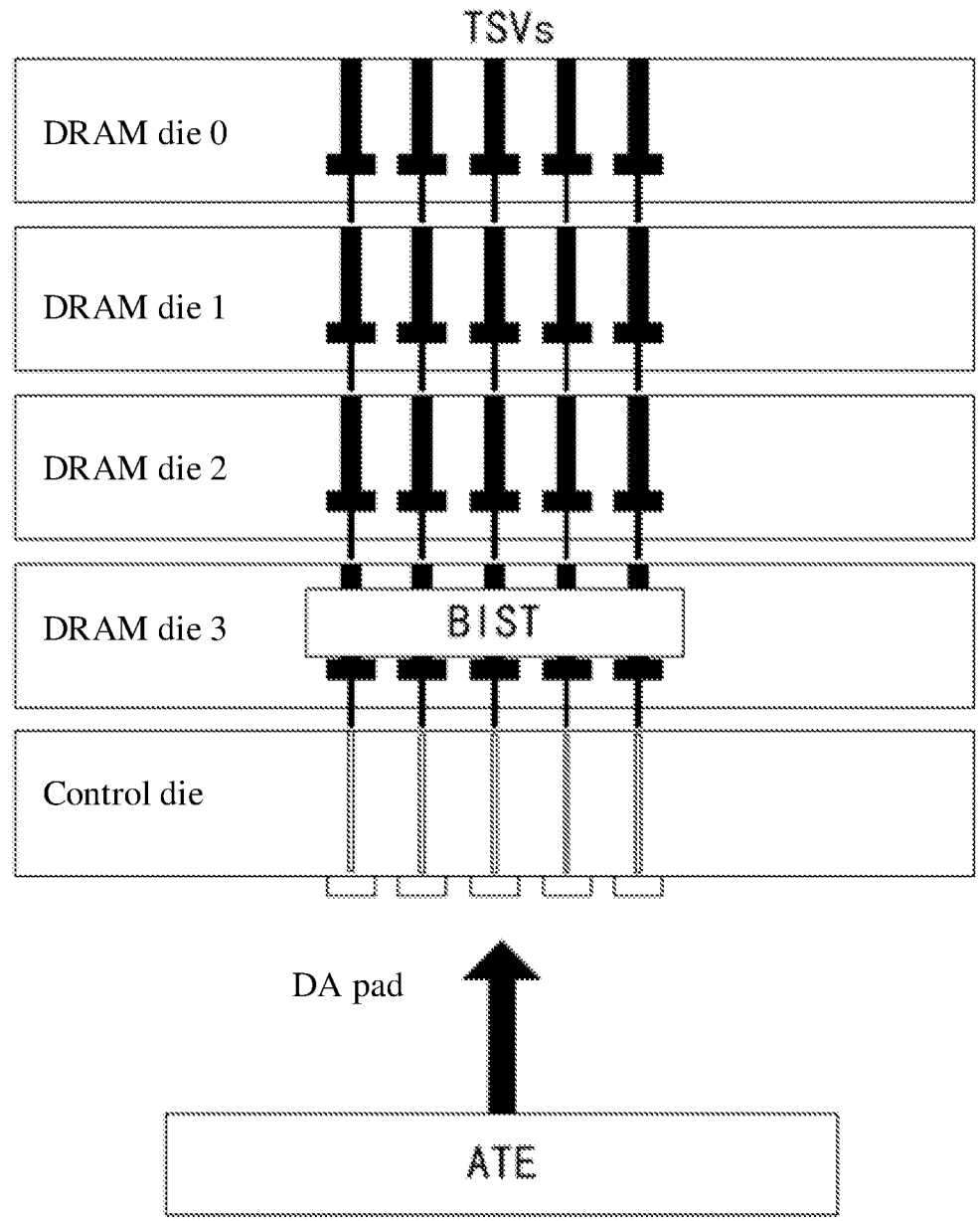
FIG. 6 is a schematic diagram of a memory test method according to an embodiment of the present invention.
Figure 7:
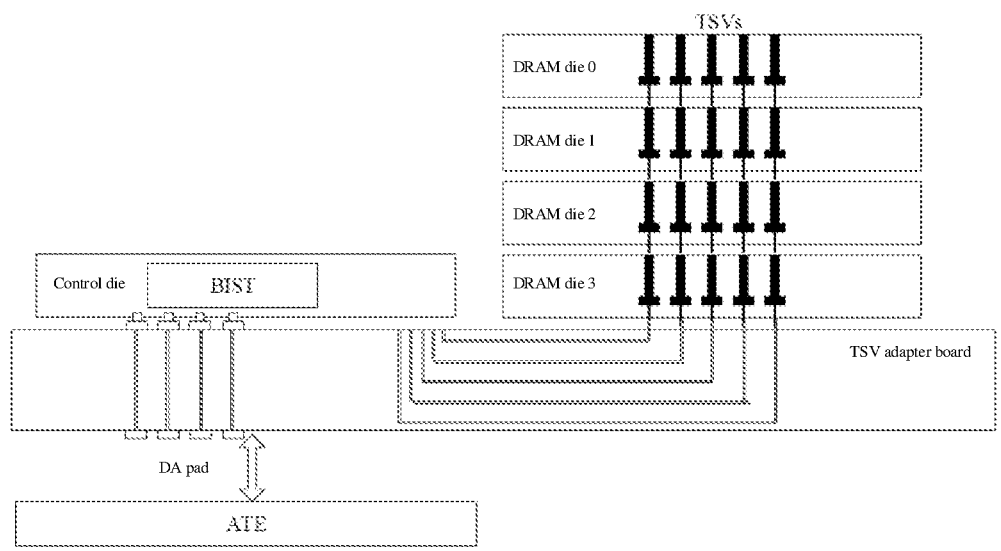
FIG. 7 is a schematic diagram of a memory test method according to an embodiment of the present invention.
Figure 8:
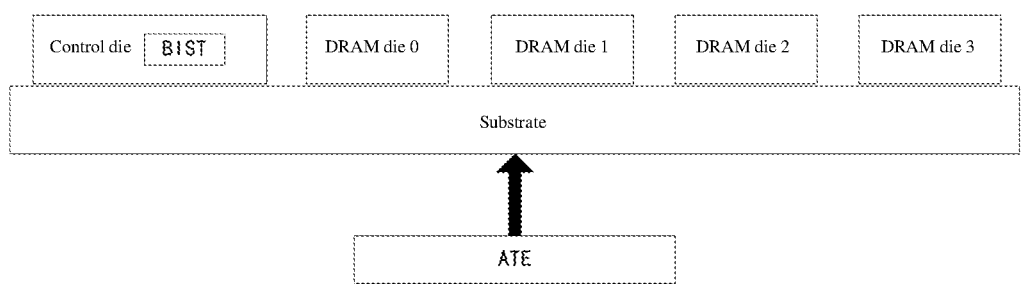
FIG. 8 is a schematic diagram of a memory test method according to an embodiment of the present invention.

FIGS. 6, 7, and 8 are schematic diagrams of a memory test method according to some embodiments of the present invention.

The difference between the embodiment shown in FIG. 6 and that shown in FIG. 3 is that the BIST circuit in FIG. 6 may be disposed in any one of the DRAM dies that are vertically stacked on the controller. An example in which the BIST circuit is disposed in the DRAM die 3 is shown in FIG. 6. The BIST circuit herein may also perform the memory test method as described in the foregoing embodiments.

The difference between an embodiment shown in FIG. 7 and that shown in FIG. 3 is that, in FIG. 7, the DRAM dies 0 to 3 are vertically stacked consecutively, and the vertically stacked DRAM dies 0 to 3 may be horizontally interconnected to the controller using a TSV adapter board. The BIST circuit of FIG. 7 may also perform the memory test method described in the foregoing embodiments.

The difference between an embodiment shown in FIG. 8 and that shown in FIG. 3 is that, in FIG. 8, the DRAM dies 0 to 3 and the controller are all horizontally distributed on a substrate of the same storage device. The BIST circuit of FIG. 8 may also perform the memory test method described in the foregoing embodiments.

Figure 9:
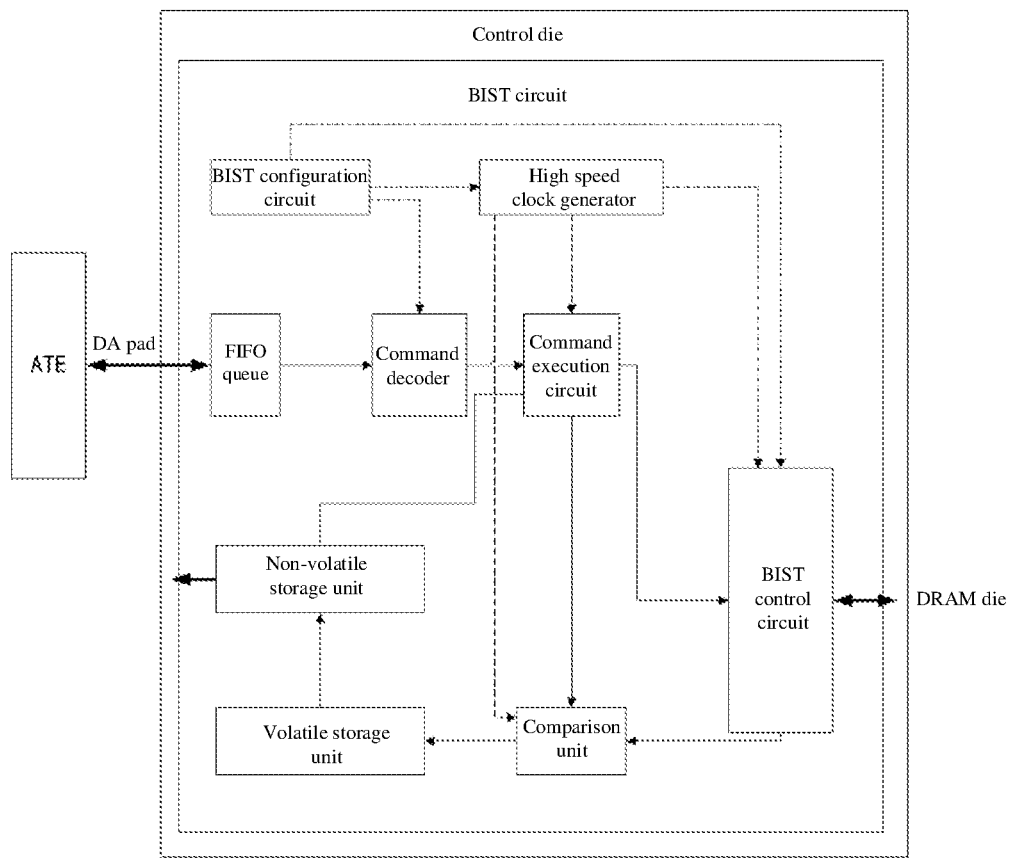
FIG. 9 is a schematic diagram of a memory test method according to an embodiment of the present invention.

FIG. 9 shows an example in which the BIST circuit is disposed in the controller in the storage device. As shown in FIG. 9, the BIST circuit may include a BIST configuration circuit, a high-speed clock generator, a FIFO queue, a command decoder, a command execution circuit, a BIST control circuit, a non-volatile storage unit, a volatile storage unit, and a comparison unit.

Referring to FIG. 9, the BIST configuration circuit may be configured to receive configuration information from ATE. The configuration information may include a clock signal frequency, an adopted working mode, whether one memory or all memories are currently tested for a test performed by the BIST circuit.

The BIST configuration circuit may be connected to the high-speed clock generator, and may send, to the high-speed clock generator, a frequency of a test clock signal that currently needs to be generated, so that the high-speed clock generator may generate the test clock signal of the corresponding frequency based on the frequency.

The BIST configuration circuit may be further connected to the command decoder, and may send a currently specified target working mode to the command decoder, so that the command decoder may parse, based on the currently specified target working mode, a received command signal sent by the ATE.

The BIST configuration circuit may be further connected to the BIST control circuit, and may send, to the BIST control circuit, information about whether one of, some of, or all of the memories are currently tested, so that the BIST control circuit may determine a to-be-tested memory based on the information.

Referring to FIG. 9, the high-speed clock generator may be respectively connected to the command execution circuit, the comparison unit, and the BIST control circuit, and respectively output the test clock signal to the command execution circuit, the comparison unit, and the BIST control circuit, so that the command execution circuit, the comparison unit, and the BIST control circuit may test the to-be-tested memory based on the test clock signal.

In some embodiments, the high-speed clock generator may be a Phase Locked Loop (PLL). However, the present specification is not limited in this regard.

In the embodiment shown in FIG. 9, the FIFO queue may receive and buffer various command signals from the ATE by using DA pads. The command signals may include, but not limited to, a timing set command such as a timing interval/event; signals timing adjust such as add/reduce CS delay; a normal command such as Active/Precharge; a test mode of DRAM die command (since the BIST circuit needs to use a test mode of DRAM die to perform a DRAM test); an event loop control command; a voltage/current set/measure command; a MISC command such as a BIST Config command, read BIST result command, or recover DRAM command, etc. When the FIFO queue is empty, the command execution circuit may stop executing the test process.

In some embodiments, the command decoder may be respectively connected to the FIFO queue, the BIST configuration circuit, and the command execution circuit, and may read the command signal from the FIFO queue based on a clock signal output by the ATE, and then parse the read command signal based on the target working mode output by the BIST configuration circuit to interpret the command signal. When the parsed command signal indicates that a DRAM die is to be tested, the command decoder may send the parsed command signal to the command execution circuit to notify the command execution circuit to start testing the DRAM die.

After receiving the signal sent by the command decoder, the command execution circuit may generate, by using a to-be-tested data generation algorithm built-in in the command execution circuit, to-be-tested data used to test the DRAM die, generate to-be-tested addresses consecutively based on the test clock signal, and then send the to-be-tested data and the to-be-tested addresses thereof to the BIST control circuit.

After receiving the to-be-tested data and the to-be-tested addresses sent by the command execution circuit, the BIST control circuit may determine, based on information sent by the BIST configuration circuit, whether the current to-betested memory is one target memory or all the memories. Then, in response to the to-be-tested memory being one target memory, the BIST control circuit may write the to-be-tested data into storage units corresponding to to-be-tested addresses of the target memory based on the test clock signal. Then, in response to the to-be-tested memory being all the memories, the BIST control circuit may respectively write the to-be-tested data into storage units corresponding to to-be-tested addresses of the memories based on the test clock signal.

The BIST control circuit may send the to-be-tested data to the to-be-tested DRAM die, and then read output data from storage units corresponding to the to-be-tested addresses, and input the output data to the comparison unit.

The comparison unit may obtain the to-be-tested addresses and the corresponding to-be-tested data thereof from the command execution circuit, perform one-to-one comparison on the output data and the to-be-tested data of the corresponding to-be-tested addresses, record a to-be-tested address corresponding to a storage unit with an inconsistent comparison result, and write the to-be-tested address into the volatile storage unit as an incorrect address.

The incorrect address stored in the volatile storage unit may be written into the non-volatile storage unit for storage.

When the storage device is tested again, the command execution circuit may first read the previously recorded incorrect address from the non-volatile storage unit, and then automatically skip the to-be-tested addresses that have been previously tested when generating a current to-be-tested address. In this way, the storage unit corresponding to the incorrect address may be prevented from being repeatedly tested, thereby reducing computing resource consumption.

In some embodiments, a test result stored in the non-volatile storage unit may be further provided externally, for example, to the controller or the ATE to notify of a specific storage unit having an error, so that the storage unit may be repaired or replaced.

Figure 10:
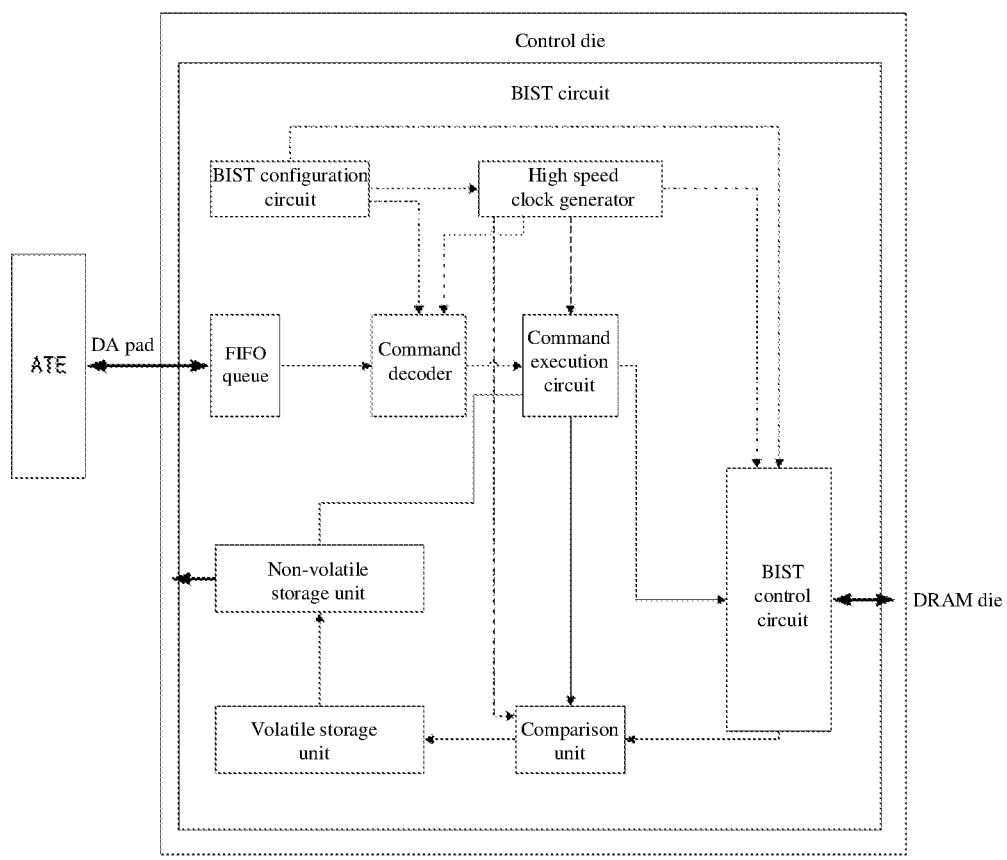
FIG. 10 is a schematic diagram of a memory test method according to an embodiment of the present invention.

FIG. 10 is a schematic diagram of a memory test method according to an embodiment of the present invention. The difference between the embodiment shown in FIG. 10 and that shown in FIG. 9 is that, in FIG. 10, the test clock signal generated by the high-speed clock generator may be directly provided to the command decoder, so that the command decoder may read the command signal from the FIFO queue based on the test clock signal.

According to the memory test method provided in this implementation of the present invention, the BIST circuit is used to test a memory, so that a high-speed clock needed for testing a DRAM may be generated by using the high-speed clock generator, such as a PLL, built-in in the BIST circuit. Therefore, a low-speed clock of the machine may be used to generate a high-speed clock for use by the BIST circuit, so that a whole wafer may be tested in one touch down, thereby reducing test cost and test time.

The ATE may further program the BIST circuit by using a small quantity of DA pads, and a command of the ATE may be parsed into a configuration of the BIST circuit, such as a test mode of DRAM die command, for execution. In addition, in some embodiments, a TSV path used for testing a DRAM die may be the same as that used for the actual operation, and the test time sequence is closer to the sequence for the actual operation of the DRAM die. Furthermore, the BIST circuit may simultaneously test all DRAM dies in a stack, thereby reducing test time.

Figure 11:
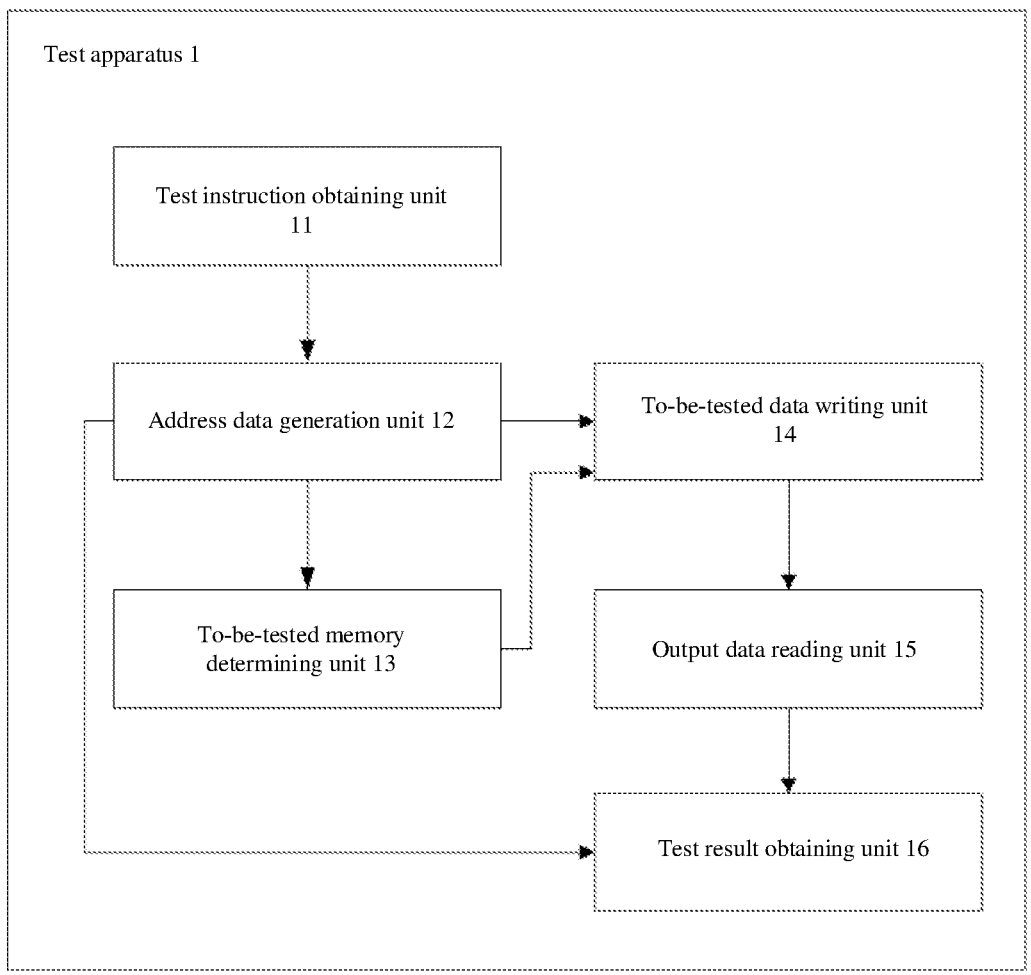
FIG. 11 is a schematic diagram of a memory test apparatus according to an embodiment of the present invention.

FIG. 11 is a schematic diagram of a memory test apparatus according to an embodiment of the present invention.

As shown in FIG. 11, in some embodiments, the test apparatus 1 may include a test instruction obtaining unit 11, an address data generation unit 12, a to-be-tested memory determining unit 13, a to-be-tested data writing unit 14, an output data reading unit 15, and a test result obtaining unit 16.

The test instruction obtaining unit 11 may be configured to obtain a test instruction. The address data generation unit 12 may be configured to generate, in response to the test instruction, a test clock signal, a to-be-tested address and to-be-tested data. The to-be-tested memory determining unit 13 may be configured to determine a to-be-tested memory from memories of a storage device. The storage device may include a self-test circuit. The to-be-tested data writing unit 14 may be configured to write the to-be-tested data into a storage unit corresponding to the to-be-tested address of the to-be-tested memory. The output data reading unit 15 may be configured to read output data from the storage unit corresponding to the to-be-tested address of the to-be-tested memory. The test result obtaining unit 16 may be configured to compare the to-be-tested data and the output data to obtain a test result of the to-be-tested memory.

In some embodiments, the self-test circuit may include a FIFO queue. The test instruction obtaining unit 11 may include: a buffering unit, which may be configured to buffer, by using the FIFO queue, a command signal sent by ATE, where a working frequency of the test clock signal is higher than a frequency of a clock signal output by the ATE, or if the frequency of the test clock signal is equal to the frequency of the clock signal output by the ATE, a phase of the test clock signal is different from a phase of the clock signal output by the ATE; and a signal reading unit, which may be configured to read the command signal from the FIFO queue.

In some embodiments, the test instruction obtaining unit 11 may further include: a mode determining unit, which may be configured to determine a target working mode of the self-test circuit; and a command parsing unit, which may be configured to parse the command signal based on the target working mode, and set the command signal to be the test instruction.

In some embodiments, the mode determining unit may include: a first configuration information obtaining unit, which may be configured to obtain first configuration information from the ATE; and a target working mode determining unit, which may be configured to determine the target working mode based on the first configuration information.

In some embodiments, the self-test circuit may further include a clock signal generator. The test apparatus 1 may further include: a second configuration information obtaining unit, which may be configured to obtain second configuration information from the ATE; a test frequency determining unit, which may be configured to determine a frequency of the test clock signal based on the second configuration information; and a test clock generation unit, which may be configured to generate, by using the clock signal generator, the test clock signal meeting the frequency.

In some embodiments, the signal reading unit may include: a third configuration information obtaining unit, which may be configured to obtain third configuration information from the ATE; a reading frequency determining unit, which may be configured to determine a reading frequency of the command signal based on the third configuration information; and a first command signal reading unit, which may be configured to: in response to the reading frequency being equal to the frequency of the test clock signal, read the command signal from the FIFO queue based on the test clock signal.

In some embodiments, the signal reading unit may further include: a second command signal reading unit, which may be configured to: in response to the reading frequency being equal to the frequency of the clock signal output by the ATE, read the command signal from the FIFO queue based on the clock signal output by the ATE.

In some embodiments, the to-be-tested memory determining unit 13 may include: a fourth configuration information obtaining unit, which may be configured to obtain fourth configuration information from the ATE; and a to-be-tested memory determining unit, which may be configured to determine the to-be-tested memory based on the fourth configuration information. The to-be-tested memory may be one or more target memories in the storage device.

In some embodiments, the to-be-tested data writing unit 14 may include: a first writing unit, which may be configured to: in response to the to-be-tested memory being one target memory in the storage device, write the to-be-tested data into a storage unit corresponding to a to-be-tested address of the target memory.

In some embodiments, the to-be-tested data writing unit 14 may include: a second writing unit, which may be configured to: in response to the to-be-tested memory being a plurality of target memories in the storage device, respectively write the to-be-tested data into storage units corresponding to to-be-tested addresses of the plurality of target memories.

In some embodiments, the test result obtaining unit 16 may include: a comparison result obtaining unit, which may be configured to compare the to-be-tested data and the output data to obtain a comparison result; and an incorrect address recording unit, which may be configured to: in response to the comparison result being not matching, record the to-be-tested address corresponding to the to-be-tested data as an incorrect address, where the test result includes the incorrect address.

In some embodiments, the self-test circuit may include a volatile storage unit and a non-volatile storage unit. The test apparatus 1 may further include: a test result buffering unit, which may be configured to write the test result of the to-be-tested memory into the volatile storage unit; and a test result storage unit, which may be configured to write the test result in the volatile storage unit into the non-volatile storage unit for storage.

In some embodiments, the self-test circuit may include a non-volatile storage unit, and the non-volatile storage unit may be configured to store an incorrect address of the to-be-tested memory. The address data generation unit 12 may include: an incorrect address obtaining unit, which may be configured to obtain the incorrect address stored in the non-volatile storage unit; and a to-be-tested address generation unit, which may be configured to automatically skip the incorrect address when generating the to-be-tested address.

In some embodiments, the storage device may further include a controller, and the self-test circuit may be located in the controller.

In some embodiments, the memories of the storage device may be vertically stacked on or beneath the controller.

In some embodiments, the self-test circuit may be located in a memory of the storage device.

In some embodiments, the test apparatus 1 may be disposed in the self-test circuit.

This invention further provides an electronic device. The electronic device may include: one or more processors and a storage apparatus, configured to store one or more programs. Upon being executed by the one or more processors, the one or more programs may cause the one or more processors to perform the method according to any one of the foregoing embodiments.

This invention further provides a computer-readable storage medium in which a computer program is stored. Upon being executed by a processor, the computer program may cause the method according to any one of the foregoing embodiments to be performed. The foregoing method embodiments may be referred to for details, which will not be repeatedly presented herein for the sake of conciseness.

A person skilled in the art can easily figure out other embodiments of the present invention after considering the specification and practicing the invention that is disclosed herein. This application is intended to cover any variations, functions, or adaptive changes of the present invention. These variations, functions, or adaptive changes comply with general principles of the present invention and include common knowledge or a commonly used technical means that is in the technical field and that is not disclosed in the present invention. The specification and the embodiments are merely considered as examples, and the actual scope and spirit of the present invention are specified by the claims.

What is claimed is:

1. A memory test method, comprising:
obtaining a test instruction;
generating, in response to the test instruction, a test clock signal, a to-be-tested address and to-be-tested data;
determining a to-be-tested memory from memories of a storage device, the storage device comprising a self-test circuit, wherein the self-test circuit comprises a first-in-first-out queue;
writing the to-be-tested data into a storage unit corresponding to the to-be-tested address of the to-be-tested memory;
reading output data from the storage unit corresponding to the to-be-tested address of the to-be-tested memory; and
comparing the to-be-tested data and the output data to obtain a test result of the to-be-tested memory, and wherein obtaining the test instruction comprises:
buffering, by using the first-in-first-out queue, a command signal sent by automatic test equipment, wherein:
(1). a frequency of the test clock signal is higher than a frequency of a clock signal output by the automatic test equipment, or
(2). if the frequency of the test clock signal is equal to the frequency of the clock signal output by the automatic test equipment, a phase of the test clock signal is different from a phase of the clock signal output by the automatic test equipment; and
reading the command signal from the first-in-first-out queue.

2. The method of claim 1, wherein obtaining the test instruction further comprises:
determining a target working mode of the self-test circuit; and
parsing the command signal based on the target working mode and setting the command signal to be the test instruction.

3. The method of claim 2, wherein determining a target working mode of the self-test circuit comprises:
obtaining, from the automatic test equipment, first configuration information; and determining, based on the first configuration information, the target working mode.

4. The method of claim 1, wherein the self-test circuit further comprises a clock signal generator, and the method further comprises:
obtaining, from the automatic test equipment, second configuration information;
determining, based on the second configuration information, the frequency of the test clock signal; and
generating, by the clock signal generator, the test clock signal having the determined frequency of the test clock signal.

5. The method of claim 1, wherein reading the command signal from the first-in-first-out queue comprises:
obtaining, from the automatic test equipment, third configuration information;
determining, based on the third configuration information, a reading frequency of the command signal; and
in response to the reading frequency being equal to the frequency of the test clock signal, reading, based on the test clock signal, the command signal from the first-in-first-out queue.

6. The method of claim 5, wherein reading the command signal from the first-in-first-out queue further comprises:
in response to the reading frequency being equal to the frequency of the clock signal output by the automatic test equipment, reading, based on the clock signal output by the automatic test equipment, the command signal from the first-in-first-out queue.

7. The method of claim 1, wherein determining a to-be-tested memory from memories of a storage device comprises:
obtaining, from the automatic test equipment, fourth configuration information; and
determining, based on the fourth configuration information, the to-be-tested memory, the to-be-tested memory being one or more target memories in the storage device.

8. The method of claim 7, wherein writing the to-be-tested data into a storage unit corresponding to the to-be-tested address of the to-be-tested memory comprises:
in response to the to-be-tested memory being one target memory in the storage device, writing the to-be-tested data into a storage unit corresponding to a to-be-tested address of the target memory.

9. The method of claim 7, wherein writing the to-be-tested data into a storage unit corresponding to the to-be-tested address of the to-be-tested memory comprises:
in response to the to-be-tested memory being a plurality of target memories in the storage device, respectively writing the to-be-tested data into storage units corresponding to to-be-tested addresses of the plurality of target memories.

10. The method of claim 1, wherein comparing the to-be-tested data and the output data to obtain a test result of the to-be-tested memory comprises:
comparing the to-be-tested data and the output data to obtain a comparison result; and
in response to the comparison result being not matching, recording the to-be-tested address corresponding to the to-be-tested data as an incorrect address, the test result comprising the incorrect address.

11. The method of claim 10, wherein the self-test circuit comprises a volatile storage unit and a non-volatile storage unit, and the method further comprises:
writing the test result of the to-be-tested memory into the volatile storage unit; and writing the test result in the volatile storage unit into the non-volatile storage unit for storage.

12. The method of claim 1, wherein the self-test circuit comprises a non-volatile storage unit, configured to store an incorrect address of the to-be-tested memory, and generating, in response to the test instruction, a to-be-tested address comprises:
obtaining the incorrect address stored in the non-volatile storage unit; and
automatically skipping the incorrect address when generating the to-be-tested address.

13. The method of claim 1, wherein the storage device further comprises a controller, the self-test circuit located in the controller.

14. The method of claim 13, wherein the memories of the storage device are vertically stacked on or beneath the controller.

15. The method of claim 1, wherein the self-test circuit is located in a memory of the storage device.

16. The method of claim 1, wherein the method is performed by the self-test circuit.

17. A memory test apparatus, comprising:
a test instruction obtaining unit, configured to obtain a test instruction;
an address data generation unit, configured to generate, in response to the test instruction, a test clock signal, a to-be-tested address and to-be-tested data;
a to-be-tested memory determining unit, configured to determine a to-be-tested memory from memories of a storage device, the storage device comprising a self-test circuit, wherein the self-test circuit comprises a first-in-first-out queue;
a to-be-tested data writing unit, configured to write the to-be-tested data into a storage unit corresponding to the to-be-tested address of the to-be-tested memory;
an output data reading unit, configured to read output data from the storage unit corresponding to the to-be-tested address of the to-be-tested memory; and
a test result obtaining unit, configured to compare the to-be-tested data and the output data to obtain a test result of the to-be-tested memory, and wherein to obtain the test instruction, the test instruction obtaining unit is further configured to:
buffer, by using the first-in-first-out queue, a command signal sent by automatic test equipment, wherein:
(1). a frequency of the test clock signal is higher than a frequency of a clock signal output by the automatic test equipment, or
(2). if the frequency of the test clock signal is equal to the frequency of the clock signal output by the automatic test equipment, a phase of the test clock signal is different from a phase of the clock signal output by the automatic test equipment; and
read the command signal from the first-in-first-out queue.

18. An electronic device, comprising:
one or more processors; and
a storage apparatus, configured to store one or more programs, wherein upon being executed by the one or more processors, the one or more programs cause the one or more processors to perform the method of claim 1.

19. A computer-readable storage medium storing a computer program, wherein upon being executed by a processor, the computer program causes the method of claim 1 to be performed.

* * * * *